United States Patent
Takahashi

(10) Patent No.: US 11,939,231 B2
(45) Date of Patent: Mar. 26, 2024

(54) METHOD OF SYNTHESIZING MOLYBDENUM OXYCHLORIDE BY REACTING MOLYBDENUM OXIDE POWDER AND CHLORINE GAS AND GROWING CRYSTALS OF MOLYBDENUM OXYCHLORIDE FROM THE GASEOUS RAW MATERIAL

(71) Applicant: JX Nippon Mining & Metals Corporation, Tokyo (JP)

(72) Inventor: Hideyuki Takahashi, Ibaraki (JP)

(73) Assignee: JX METALS CORPORATION, Tokyo (JP)

( * ) Notice: Subject to any disclaimer, the term of this patent is extended or adjusted under 35 U.S.C. 154(b) by 306 days.

(21) Appl. No.: 16/955,547

(22) PCT Filed: Apr. 12, 2019

(86) PCT No.: PCT/JP2019/015899
§ 371 (c)(1),
(2) Date: Jun. 18, 2020

(87) PCT Pub. No.: WO2020/021786
PCT Pub. Date: Jan. 30, 2020

(65) Prior Publication Data
US 2021/0009436 A1    Jan. 14, 2021

(30) Foreign Application Priority Data
Jul. 25, 2018    (JP) .................................. 2018-138963

(51) Int. Cl.
*C30B 25/16*    (2006.01)
*C01G 39/00*    (2006.01)
(Continued)

(52) U.S. Cl.
CPC ............ *C01G 39/00* (2013.01); *C30B 23/002* (2013.01); *C30B 23/066* (2013.01); *C30B 25/16* (2013.01);
(Continued)

(58) Field of Classification Search
CPC ....... C30B 23/00; C30B 23/002; C30B 23/02; C30B 23/06; C30B 23/066; C30B 25/00;
(Continued)

(56) References Cited

U.S. PATENT DOCUMENTS

| | | | | |
|---|---|---|---|---|
| 1,329,380 A | * | 2/1920 | Doerner | C01G 39/04 423/60 |
| 2,936,214 A | * | 5/1960 | Scheller | C01G 33/00 423/68 |

(Continued)

FOREIGN PATENT DOCUMENTS

| | | |
|---|---|---|
| CN | 102632245 A | 8/2012 |
| EA | 004480 B1 | 4/2004 |

(Continued)

OTHER PUBLICATIONS

N. Hultgren, et al. publication entitled "Gaseous molybdenum oxychloride," J. Phys. Chem., vol. 60, p. 947-49 (1956). (Year: 1956).*

(Continued)

*Primary Examiner* — Kenneth A Bratland, Jr.
(74) *Attorney, Agent, or Firm* — Howson & Howson LLP

(57) ABSTRACT

Provided is a method of producing a high purity molybdenum oxychloride by including means of sublimating and reaggregating a raw material molybdenum oxychloride in a reduced-pressure atmosphere, or means of retaining a gaseous raw material molybdenum oxychloride, which was synthesized in a vapor phase, in a certain temperature range, and thereby growing crystals to obtain a higher purity (Continued)

molybdenum oxychloride having a high bulk density and high hygroscopicity resistance.

6 Claims, 6 Drawing Sheets

(51) Int. Cl.
    *C30B 23/00*       (2006.01)
    *C30B 23/06*       (2006.01)
    *C23C 16/455*     (2006.01)

(52) U.S. Cl.
    CPC .... *C01P 2006/10* (2013.01); *C23C 16/45553* (2013.01)

(58) Field of Classification Search
    CPC ......... C30B 25/02; C30B 25/10; C30B 25/16; C30B 29/00; C30B 29/10; C30B 29/12; C30B 29/16; C30B 29/22; C30B 29/32; C01G 39/00; C01P 2006/10; C23C 16/22; C23C 16/40; C23C 16/4481; C23C 16/455; C23C 16/45553
    USPC ........ 117/84, 88, 94, 99, 102, 106, 937, 940
    See application file for complete search history.

(56) References Cited

U.S. PATENT DOCUMENTS

| | | | |
|---|---|---|---|
| 3,390,953 A | | 7/1968 | Erhard |
| 3,420,619 A | | 1/1969 | Booker et al. |
| 3,432,255 A | * | 3/1969 | Long .................. C22B 1/08 |
| | | | 423/60 |
| 5,840,897 A | | 11/1998 | Kirlin et al. |
| 6,126,996 A | | 10/2000 | Kirlin et al. |
| 7,279,421 B2 | | 10/2007 | Suzuki |
| 7,312,140 B2 | | 12/2007 | Machida et al. |
| 7,646,084 B2 | | 1/2010 | Suzuki |
| 2011/0305309 A1 | | 12/2011 | Brown |

FOREIGN PATENT DOCUMENTS

| | | |
|---|---|---|
| GB | 374250 A | 6/1932 |
| GB | 1038508 A | 8/1966 |
| JP | H06-093314 A | 4/1994 |
| JP | H08-277263 A | 10/1996 |
| JP | 2000-019045 A | 1/2000 |
| JP | 2003-225808 A | 8/2003 |
| JP | 2003-252845 A | 9/2003 |
| WO | 2007/001921 A2 | 1/2007 |

OTHER PUBLICATIONS

Jeyakumar Kandasamy et al., "Application of Molybdenum(VI) Dichloride Dioxide ($MoO_2Cl_2$) in Organic Transformations", J. Chem. Sci., Indian Academy of Sciences, vol. 121, No. 2, pp. 111-123, Mar. 2009.

Partial European Search Report dated Mar. 30, 2021 issued in corresponding EP Application No. 19842224.8.

T. Hijikata et al., "Development of Low-Temperature Chlorination by using Molybdenum Pentachloride (II)", CRIEPI Research Report, No. T99084, pp. 1-15, Jul. 2000 (English Abstract only).

S.V. Plusheva et al., "Application of Halides to the Production of Pure Molybdenum", Journal of the Less-Common Metals, vol. 86, pp. 299-304, Jul. 1982.

K. A. Gesheva et al., "Composition and Microstructure of Black Molybdenum Photothermal Converter Layers Deposited by the Pyrolytic Hydrogen Reduction of $MoO_2Cl_2$", Thin Solid Films, vol. 79, pp. 39-49, 1981 (month unknown).

Rita G. De Noronha et al., "$MoO_2Cl_2$ as a novel catalyst for the synthesis of a-aminophosphonates", Catalysis Communications, vol. 12, Issue 5, pp. 337-340, Jan. 2011 (Abstract only).

Y. Monteil et al., "Raman and thermodynamics studies of CVT of $MoO_2$ and $TiO_2$", Journal of Crystal Growth, vol. 67, Issue 3, pp. 595-606, Aug. 1984 (Abstract only).

* cited by examiner

METHOD OF SYNTHESIZING MOLYBDENUM OXYCHLORIDE BY REACTING MOLYBDENUM OXIDE POWDER AND CHLORINE GAS AND GROWING CRYSTALS OF MOLYBDENUM OXYCHLORIDE FROM THE GASEOUS RAW MATERIAL

BACKGROUND

The present invention relates to a method of producing a high bulk density molybdenum oxychloride that can be suitably applied to a material for vapor phase growth of thin films or a catalyst for chemical reactions.

As thin films for use as contact plugs, wires and diffusion barrier layers under such wires in functional electronic devices such as semiconductor devices, low-resistance metal materials that are physically and chemically stable, such as molybdenum (Mo) and tungsten (W), have been often used from the past. As the diffusion barrier layer, thin films of compounds such as nitrides and carbides of these metals, are also often used.

Other than for use as a diffusion barrier layer of electronic devices, for instance, a molybdenum disulfide ($MoS_2$) thin film, which is a sulfide of molybdenum, has also been conventionally used as a lubricant layer at the sliding part of mechanical components. In recent years, an ultrathin two-dimensional structured film made from $MoS_2$ is also attracting attention as a novel metal chalcogenide material which exhibits semiconductor properties.

The foregoing molybdenum or molybdenum compound thin film is formed via the chemical vapor deposition (CVD) method of vaporizing a compound containing a molybdenum element, as precursor, decomposing and reacting the same on the base material surface, and thereby forming a thin film. Moreover, pursuant to the higher integration and higher densification of devices in recent years, pitches are becoming narrower and the depth of contact plugs is becoming deeper, and the tendency is for the metal layer to be formed at a concave part having a high aspect ratio. In order to uniformly form a metal layer on a concave part having a high aspect ratio, foremost, by using an atomic layer deposition (ALD) method, a thin metal layer is uniformly formed to be used as a seed layer in the concave part, and a metal layer to be used as a thick contact plug or wire is thereafter formed based on the foregoing CVD method or plating method.

As the precursor compound that is used upon forming the metal or metal compound based on the foregoing CVD method or ALD method, an organic metal compound, metallic carbonyl, or metal halogenide is used. As this kind of conventional technology, there are the following examples; specifically, an example of forming a $MoS_2$ film by using molybdenum chloride ($MoCl_5$) (Patent Document 1), an example of forming a Mo film by using molybdenum carbonyl ($Mo(CO)_6$) (Patent Document 2), an example of forming a Mo film by using an organic compound of molybdenum (Patent Document 3), and an example of forming $MoS_2$ (Patent Document 4).

Nevertheless, molybdenum pentachloride ($MoCl_5$), which is a general molybdenum chloride, is difficult to handle as it is unstable and spontaneously generates toxic hydrogen chloride when decomposed, and there are problems related to the preservation and storage thereof for use in industrial processes. While this kind of problem will not arise with CVD or ALD which uses metallic carbonyl as the raw material, carbonyl of metal including molybdenum has a low vapor pressure, and there is a problem in that the control of the raw material gas flow rate and pressure during CVD or ALD deposition is difficult. If an organic metal compound of a specific structure is used, it is possible to exhibit a moderate vapor pressure as the raw material for use in CVD or ALD deposition, but because time and cost are required for synthesizing an organic metal compound of such a specific structure, there is a problem in that the cost will increase as the raw material of CVD or ALD deposition for use in industrial processes.

Thus, as an approach from a substance that is different from each of the foregoing substances, as disclosed in Patent Document 5 or Non-Patent Document 1, there is a method of performing CVD deposition of molybdenum or molybdenum compound by using a molybdenum oxychloride as a raw material precursor. The molybdenum oxychloride itself is a conventionally known substance as a catalyst for chemical reactions, such as organic synthesis, as disclosed in Patent Documents 6 and 7, and Non-Patent Document 2, in addition to use as the CVD raw material described above.

Molybdenum oxychloride, as mentioned in Non-Patent Document 3, is generally synthesized by directly chloridating a molybdenum oxide ($MoO_2$) powder with a chlorine gas ($Cl_2$). Nevertheless, the synthesized molybdenum oxychloride is a fluffy, extremely light floccose powder crystal, has a low bulk density, and there is a problem in that the handling thereof in its original form is difficult and inconvenient.

PRIOR ART DOCUMENTS

Patent Documents

Patent Document 1: Japanese Patent Application Publication No. 2003-225808
Patent Document 2: Japanese Translation of PCT International Application Publication No. 2008-520834
Patent Document 3: Japanese Patent Application Publication No. 2006-097101
Patent Document 4: Japanese Translation of PCT International Application Publication No. H11-507629
Patent Document 5: Japanese Patent Application Publication No. 2000-19045
Patent Document 6: Japanese Patent Application Publication No. 2003-252845
Patent Document 7: Japanese Patent Application Publication No. H08-277263

Non-Patent Documents

Non-Patent Document 1: K. A. Gesheva et al., Thin Solid Films, Vol. 79, 1981, pp. 39-49
Non-Patent Document 2: Rita G, de Noronha et al., Cat. Commun., Vol. 12, 2011, pp. 337-340
Non-Patent Document 3: Y. Monteil et al., J. Cryst. Growth, Vol. 67, 1984, pp. 595-606

SUMMARY

Molybdenum oxychloride in a synthesized state has an extremely low bulk density as described above, and the storage and transport are inefficient due to the enormous volume thereof. Thus, the floccose powder crystals are mechanically stirred and compressed to condense the crystals, but there is a limit in the bulk density that can be increased with this kind of method. Moreover, because the surface area will increase inevitably with a crystal powder in a state of a low bulk density, there is also a problem in that the hygroscopicity resistance and chemical stability will deteriorate during its storage and transport. This kind of problem cannot be ignored in the use as a raw material of CVD or ALD or a catalyst for chemical reactions demanded in a stable, high purity precursor.

The present invention is to attempt to resolve the foregoing problems, and an object of this invention is to provide a method of producing a high bulk density molybdenum oxychloride in the production of a molybdenum oxychloride.

As a result of intense study, the present inventors discovered that a higher bulk density can be achieved by once sublimating low bulk density crystals of a molybdenum oxychloride in a synthesized state, or a stirred and compressed state, in a reduced-pressure atmosphere, and thereafter reaggregating the product, or by growing crystals while retaining a gaseous molybdenum oxychloride, which was synthesized in a vapor phase, in a predetermined temperature range, and completed the present invention based on the foregoing discovery.

Based on the foregoing discovery, the present invention provides the following:

1) A method of producing a molybdenum oxychloride including the steps of sublimating and reaggregating a raw material molybdenum oxychloride in a reduced-pressure atmosphere.
2) The method of producing a molybdenum oxychloride according to 1) above, wherein the reduced-pressure atmosphere is an atmosphere of a pressure of 1 kPa or more and 20 kPa or less.
3) A method of producing a molybdenum oxychloride including the steps of retaining a gaseous raw material molybdenum oxychloride, which was synthesized in a vapor phase, at a temperature range of 40° C. or higher and 120° C. or less in an atmospheric pressure, and thereby growing crystals.
4) The method of producing a molybdenum oxychloride according to any one of 1) to 3) above, wherein the molybdenum oxychloride is one among molybdenum dichloride dioxide ($MoO_2Cl_2$), molybdenum trichloride oxide ($MoOCl_3$) or molybdenum tetrachloride oxide ($MoOCl_4$).
5) The method of producing a molybdenum oxychloride according to any one of 1) to 4) above, further including the step of synthesizing the raw material molybdenum oxychloride by chloridating molybdenum dioxide ($MoO_2$) or molybdenum trioxide ($MoO_3$) with a chlorine gas ($Cl_2$).
6) The method of producing a molybdenum oxychloride according to any one of 1) to 5) above, wherein a bulk density of the molybdenum oxychloride is 0.5 g/cm$^3$ or more.
7) The method of producing a molybdenum oxychloride according to any one of 1) to 6) above, wherein a purity of the molybdenum oxychloride is 99.999 wt % (5N) or higher.

According to the method of the present invention, it is possible to achieve a higher bulk density of the crystals of molybdenum oxychloride having a low bulk density which was synthesized according to a general synthesizing method, and it becomes easier to handle such as the storage and transport. Moreover, the surface area of the crystals can be reduced based on such higher bulk density, and the hygroscopicity resistance and chemical stability can also be improved. Furthermore, it is also possible to simultaneously reduce impurities and improve the purity level based on the refining effect of sublimation. Based on these effects, it is possible to improve the operability of deposition and chemical reaction, as well as improve the performance and characteristics of the produced thin film and compound.

DETAILED DESCRIPTION

Figure 1:
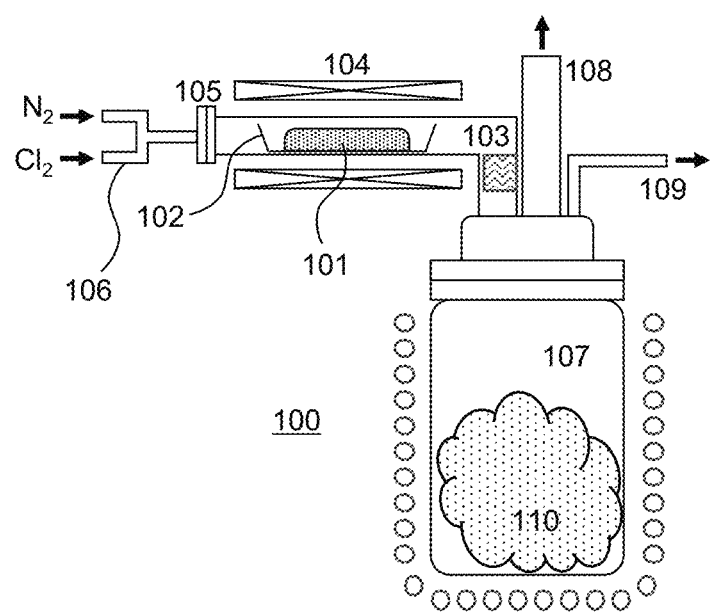
FIG. 1 is diagram showing an example of the device configuration for synthesizing a molybdenum oxychloride.

The present invention is, as the essential technical means, a method of producing a molybdenum oxychloride including the steps of sublimating a raw material molybdenum oxychloride by heating it in a reduced-pressure atmosphere, and cooling the sublimated vapor phase state molybdenum oxychloride for once again aggregating/solidifying the molybdenum oxychloride. The advantages of the present invention based on its operation and effect can be enjoyed by using a crystal powder having a low bulk density as the raw material molybdenum oxychloride. As this kind of raw material crystal powder having a low bulk density, listed may those having a bulk density of 0.1 g/cm$^3$ or less, 0.8 g/cm$^3$ or less, and even 0.5 g/cm$^3$ or less.

The heating temperature upon subjecting the raw material molybdenum oxychloride to reduced-pressure sublimation may be set to a range of 70° C. to 150° C. Since the temperature in which the raw material molybdenum oxychloride becomes sublimated will change depending on the ambient pressure during sublimation, the sublimation temperature is preferably set and adjusted according to the ambient pressure. In order to maintain the proper sublimated state according to the ambient pressure, the sublimation temperature may be preferably set to 85° C. or higher, 95° C. or higher, or even 105° C. or higher in certain cases. Similarly, in order to maintain the proper sublimated state according to the ambient pressure, the sublimation temperature may be preferably set to 140° C. or less, 130° C. or less, or even 120° C. or less in certain cases.

The molybdenum oxychloride that is sublimated and became a vapor phase state is cooled, once again becomes a solid phase state, and then becomes aggregated. Here, preferably, the molybdenum oxychloride in a vapor phase state is aggregated/solidified upon being transferred to a position that is separated by a predetermined distance from the sublimation position where the raw material molybdenum oxychloride is held and heated. The temperature at the position of cooling and subsequently aggregating/solidifying the molybdenum oxychloride may be set to a temperature that is roughly 20° C. lower than the sublimation temperature, or even lower. As an example of a specific device configuration for realizing this kind of sublimation/reaggregation, a configuration of using a reaction tube having a temperature gradient in which the temperature gradually decreases as it becomes separated from the container for holding and heating the raw material molybdenum oxychloride may be used, but the configuration is not limited thereto.

As the molybdenum oxychloride to which the method of the present invention can be applied, there are the following depending on the difference in valence of molybdenum; namely, molybdenum dichloride dioxide (VI) ($MoO_2Cl_2$), molybdenum trichloride oxide (V) ($MoOCl_3$), and molybdenum tetrachloride oxide (VI) ($MoOCl_4$). Among the above, the method of the present invention can be preferably applied to $MoO_2Cl_2$ which has a high utility value as a raw material of CVD or ALD and as a catalyst for chemical reactions.

While the sublimation/reaggregation of the molybdenum oxychloride in the method of the present invention is performed in a reduced-pressure atmosphere, the ambient pressure can be set to a pressure in a range of 1 kPa or more and 20 kPa or less. The proper pressure is set and adjusted within the foregoing pressure range according to the sublimation temperature and the reaggregation temperature. When the ambient pressure is less than 1 kPa, the sublimation/aggregation temperature will decrease and it may be difficult to control the sublimation rate, the aggregated molybdenum oxychloride may not exhibit sufficiently high density, and a sudden winding of the raw material molybdenum oxychloride tends to occur during the heating process.

Moreover, when the ambient pressure exceeds 20 kPa, the sublimation temperature will increase and the energy cost required for the heating process will also increase, and it may become difficult to control the proper sublimation/aggregation conditions due to the sublimation rate becoming too fast or the reaction tube becoming clogged. In light of the above, the ambient pressure during the sublimation/reaggregation of the present invention may be set to 3 kPa or more, and 4 kPa or more, and be set to 10 kPa or less, and 7 kPa or less.

There is no particular limitation in the method of producing the raw material molybdenum oxychloride used in the present invention so as long as the attainment of a higher bulk density can be expected based on the operation and effect of the present invention. However, as a step of synthesizing the raw material molybdenum oxychloride in which the foregoing operation and effect, particularly the operation of effect of attaining a higher bulk density, can be exhibited, the step of chloridating molybdenum dioxide ($MoO_2$) or molybdenum trioxide ($MoO_3$) with a chlorine gas ($Cl_2$) may be included in the method of the present invention. The molybdenum oxychloride obtained by chloridating $MoO_2$ or $MoO_3$ with a $Cl_2$ gas becomes a fluffy floccose crystal powder with an extremely low bulk density, but the bulk density can be considerably increased by applying the method of the present invention.

For example, the synthesis of molybdenum oxychloride by chloridating $MoO_3$ with a $Cl_2$ gas is performed by causing the $Cl_2$ gas to flow, at a predetermined flow rate, to the $MoO_3$ powder which has been heated to a reaction temperature, and causing the vapor phase molybdenum oxychloride generated from the reaction of the $MoO_3$ powder and the $Cl_2$ gas to become reprecipitated in a solid phase. The heating temperature of $MoO_3$ during the reaction is preferably set to 700° C. or higher. The vapor phase molybdenum oxychloride generated based on the foregoing reaction becomes reprecipitated in a solid phase as a result of being cooled. As an example of a specific device configuration for realizing this kind of reactive precipitation, a configuration of using a reaction tube having a temperature gradient in which the temperature gradually decreases as it becomes separated from the position of holding and heating $MoO_3$ and capable of continuously flowing the reaction gas may be used, but the configuration is not limited thereto.

When synthesizing the molybdenum oxychloride based on the foregoing reaction, since a fluffy floccose crystal powder having a low bulk density will become precipitated in a huge volume at the precipitated part, a large-capacity crystal precipitation container is preferably mounted. Since the molybdenum oxychloride in a precipitated state is extremely inconvenient to handle as is, the crystals in the container may be stirred using a stirring rod or a stirrer to reduce and compress the volume of the crystals. Here, the operation is preferably performed in an inert gas atmosphere of dried (dew-point minus 60° C. or less) nitrogen or rare gas.

Here, in synthesizing the molybdenum oxychloride, the bulk density of the precipitated solid phase molybdenum oxychloride can also be increased by growing the crystals while holding the vapor phase molybdenum oxychloride, which is generated based on the reaction of the $MoO_3$ powder and the $Cl_2$ gas, at a predetermined temperature range in an atmospheric pressure. The holding temperature is set to 40° C. or higher, and preferably 45° C. or higher. When the holding temperature is less than 40° C., a floccose crystal powder having a low bulk density will be produced. Meanwhile, when heated to 120° C. or higher, the molybdenum oxychloride will be sublimated again and cannot be recovered and, therefore, the holding temperature is set to 120° C. or less, and preferably 100° C. or less.

Accordingly, a molybdenum oxychloride crystal powder having a low bulk density can be collected as a molybdenum oxychloride having a bulk density of 0.5 g/cm$^3$ or more by applying the sublimation/reaggregation of the present invention, or applying solid precipitation in a proper temperature range. By properly controlling the sublimation/reaggregation conditions, the molybdenum oxychloride collected after undergoing reaggregation will have a bulk density of 1.0 g/cm$^3$ or more, and even 1.2 g/cm$^3$ or more.

Moreover, the method of the present invention can reduce the content of impurities contained in the molybdenum oxychloride collected after undergoing reaggregation in comparison to that of the raw material as one effect of the sublimation/reaggregation process, and the produced molybdenum oxychloride will have a purity of 99.999 wt % (5N) or higher. Note that the purity of the molybdenum oxychloride in the present invention is defined as a value obtained by analyzing the elements that are anticipated as being contained as impurities in the molybdenum oxychloride, and subtracting the total content of elements that appeared in a content above the detection limit from 100 wt %.

Here, the impurity elements anticipated in the present invention are Be, Mg, Al, K, Ga, Ge, As, Sr, Ba, W, Ti, U, Ag, Na, Co, Fe, In, Mn, Ni, Pb, Zn, Cu, Cr, Tl, Li, Th, Sc, Se, Hf, Ta, and Bi, and, among the above, K is analyzed based on the atomic absorption spectrometry (AAS) method, and elements other than K are analyzed based on the inductively coupled plasma mass spectrometry (ICP-MS) method. The content of the detection limit used in the analysis of the present invention is 0.5 wtppm for Ni and Se, and 0.1 wtppm for the other elements indicated above. Note that the impurity elements of a content that is less than the measurement limit are deemed not to be substantially contained upon calculating the purity.

As described above, the molybdenum oxychloride obtained by applying the sublimation/reaggregation of the present invention is collected via predetermined means.

Here, the collection of the molybdenum oxychloride is also preferably performed in an inert gas atmosphere. Since the bulk density of the collected molybdenum oxychloride has improved drastically from the state of the raw material, it can be stored and transported easily, and the hygroscopicity resistance is also improved during the preservation thereof. In addition to the improvement in the hygroscopicity resistance during the preservation of the molybdenum oxychloride, because the purity is also improved from the state of the raw material due to the sublimation/reaggregation process, the present invention can be suitably applied to uses requiring high purity products such as for a raw material of CVD or ALD or for a catalyst for chemical reactions.

EXAMPLES

The present invention is now specifically explained based on the Examples and Comparative Examples. The following descriptions of the Examples and Comparative Examples are merely specific examples for facilitating the understanding of the technical contents of the present invention, and the technical scope of the present invention is not limited in any way by these specific examples.

<Manufacturing Apparatus>

Foremost, in performing the method of the present invention, a molybdenum oxychloride was synthesized by chloridating $MoO_2$ or $MoO_3$ with a $Cl_2$ gas. FIG. 1 is a diagram showing an example of the configuration of the device 100 for synthesizing a molybdenum oxychloride. A $MoO_2$ or $MoO_3$ raw material 101 is placed on a raw material holding container 102, and this is placed inside a quartz reactor vessel 103. The outer periphery of the part of the reactor vessel where the raw material is placed can be heated with a raw material heating device 104, and temperature control is thereby enabled. A gas inlet port 105 is provided to one end of the reactor vessel, and a gas pipe 106 connected thereto is branched midway and leads to an introductory part of $Cl_2$ to become the reaction gas for synthesizing a molybdenum oxychloride, and an introductory part of inert gas such as $N_2$ to become the carrier gas. A valve or flow rate control device may be provided to the path of the gas pipe as needed.

A collection container 107 where the synthesized molybdenum oxychloride is precipitated and accumulated is connected to the other end of the reactor vessel 103. While the example of FIG. 1 adopts a configuration of using an L-shaped quartz tube as the reactor vessel and connecting it to the upper part of the collection container, there is no limitation in the shape or material of the reactor vessel or its mode of connection to the collection container, and may be changed as needed.

While the synthesized molybdenum oxychloride 110 based on a reaction is precipitated and accumulated inside the collection container, here, when the container is less than 40° C., the obtained molybdenum oxychloride becomes floccose with a low bulk density, and the volume tends to become enormous. Thus, when giving consideration to the collection of the obtained molybdenum oxychloride or work efficiency of the synthesizing process, it is preferable to use a large collection container with wide opening. Meanwhile, by maintaining the container to be within a range of 40° C. to 120° C., it is possible to precipitate molybdenum oxychloride crystals having a high bulk density.

Connected to the collection container are an exhaust pipe 108 which discharges unreacted chlorine or sublimatory chloride and leads to a detoxifying device which renders these substances harmless, and a vacuum pipe 109 which leads to a vacuum pump for adjusting the pressure inside the device.

Figure 2A:
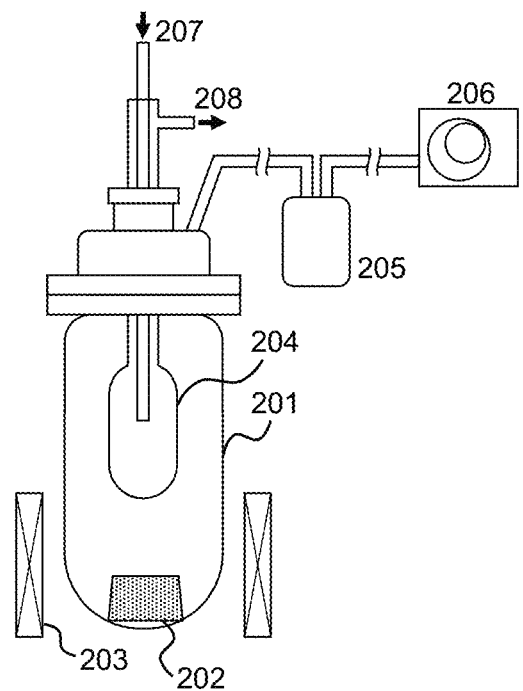
FIG. 2 is a diagram showing an example of the device configuration for sublimating/reaggregating a molybdenum oxychloride.

FIG. 2 is a diagram showing an example of the device configuration for sublimating and reaggregating a molybdenum oxychloride and used in performing the method of the present invention. The configuration of FIG. 2(a) includes a raw material holding container 201, a molybdenum oxychloride raw material 202 is placed therein, and the raw material is heated with the raw material heating device 203. Moreover, the inside of the raw material holding container 201 is exhausted with a vacuum pumping unit 206 connected via a liquid-nitrogen trap 205 to achieve a reduced-pressure atmosphere of a predetermined pressure. A reaggregation/precipitation unit 204 is mounted at the upper part within the raw material holding container, and a liquid or gas coolant is caused to flow therein to achieve a predetermined cooling temperature. The raw material heated to a predetermined sublimation temperature under a predetermined pressure is vaporized based on sublimation, re-cooled with the reaggregation/precipitation unit at the upper part thereof, and becomes solidified and precipitated on the surface thereof.

Figure 2B:
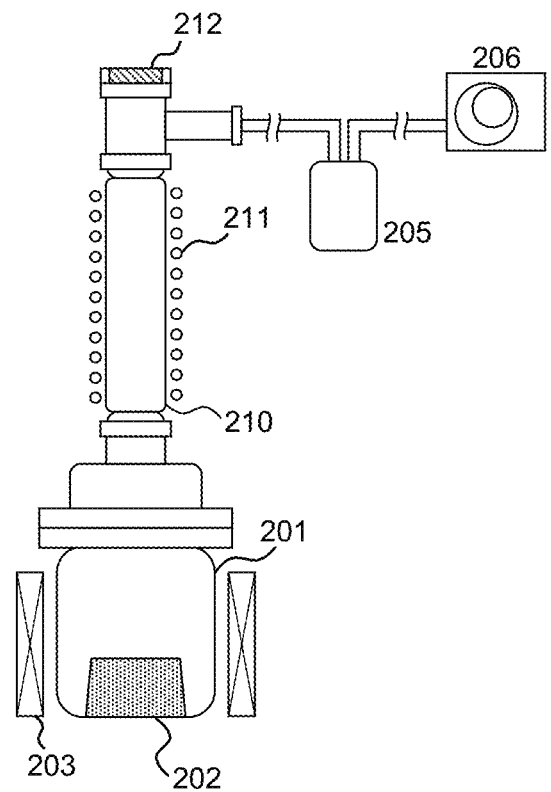

The configuration of FIG. 2(b) is a modification of the configuration of the reaggregation/precipitation unit, which is configured as a reaction tube 210 that is separated to the outside from within the raw material holding container. A temperature control mechanism 211 having a coolant circulation mechanism and/or a heating mechanism may also be placed outside the reaction tube. Moreover, the reaction tube may be connected to the upper part of the raw material holding container, and the inside thereof may be observed via the view port 212 from the upper part thereof. The inside of the raw material holding container and the reaction tube is exhausted with the vacuum pumping unit 206 connected via the liquid-nitrogen trap 205 to achieve a reduced-pressure atmosphere of a predetermined pressure. In the example of FIG. 2(b), while an exhaust device is connected to one end of a T-shaped branched pipe connected to the upper part of the reaction tube, there is no limitation to this configuration, and the configuration for connecting the exhaust device may be changed as needed.

Even in the configuration of FIG. 2(b), while the raw material heated within the raw material holding container becomes vaporized based on sublimation, it will reach the reaction tube which was cooled to a predetermined temperature, then be re-cooled, and become solidified and precipitated within the reaction tube. The configuration of FIG. 2(a) is advantageous in terms that the device configuration is simple and production can be performed easily, and the configuration of FIG. 2(b) is advantageous in that it is suitable for mass production by adjusting the capacity of the reaction tube and high-purity products can be obtained. The synthesizing apparatus and sublimation device described above are examples of the device configuration that may be used, and it goes without saying that devices configured by modifying the foregoing configuration or devices having a different configuration may also be applied so as long as the purpose of this invention can be achieved.

<Production Example>

Comparative Example 1

Comparative Example 1 is an example in which sublimation and reaggregation are not performed in a reduced-pressure atmosphere, which is the essential means in the present invention; that is, an example of only performing the synthesis of a molybdenum oxychloride. Here, $MoO_3$ and a $Cl_2$ gas were reacted to synthesize $MoO_2Cl_2$ by using the device having the configuration shown in FIG. 1.

A high purity $MoO_3$ (purity: 4N) powder in an amount of 61.5 g was placed in a holding container made of quartz, and this was disposed at the end of an L-shaped reaction tube made of quartz. While supplying a nitrogen gas as a carrier gas into the reaction tube, and $MoO_3$ was gradually heated with an electric furnace and the heating temperature of $MoO_3$ was retained upon reaching 720° C. When a $Cl_2$ gas was supplied into the reaction tube in this state at a flow rate of 30 mL/minute, $MoO_3$ and $Cl_2$ were reacted, the generated $MoO_2Cl_2$ in a vapor phase state was transported from the reaction tube to the collection container, and the $MoO_2Cl_2$ cooled within the collection container became precipitated in a solid phase state.

Figure 3:
FIG. 3 is a diagram showing the appearance of the molybdenum oxychloride of Comparative Example 1.

Nevertheless, the $MoO_2Cl_2$ precipitated within the collection container, as shown in FIG. 3, was in the form of floccose crystals having a fluffy appearance and an extremely low bulk density, and while a 4 L collection container was connected to the reactor vessel in this example, because the entire reactor vessel was filled with the foregoing floccose precipitate, the supply of chlorine was stopped at such point in time and the synthesis of the $MoO_2Cl_2$ was ended. The precipitated $MoO_2Cl_2$ was cooled with a nitrogen flow, and the $MoO_2Cl_2$ was thereafter collected in a nitrogen atmosphere. At the time of this collection, the $MoO_2Cl_2$ in a precipitated state was foremost stirred with a stirring rod to reduce the volume within the collection container and thereafter transferred to a storage container, and was further stirred within the storage container using a stirrer to further reduce the volume. The obtained $MoO_2Cl_2$ had a bulk density of 0.05 $g/cm^3$, and a purity of 4N. The $MoO_2Cl_2$ yield amount was 51 g, and the yield rate was 60%.

Example 1

Figure 4:
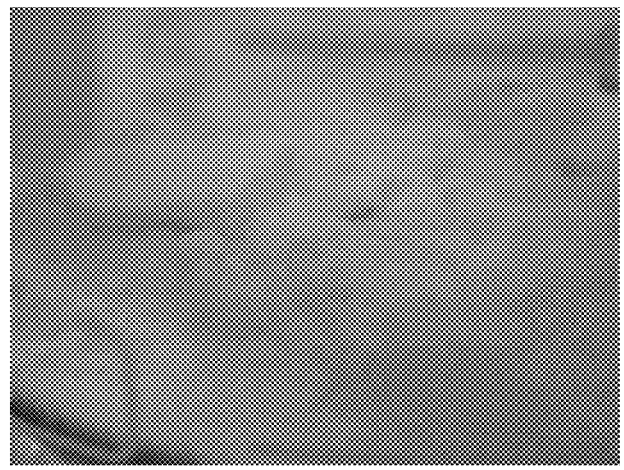
FIG. 4 is a diagram showing the appearance of the molybdenum oxychloride of Example 1.

By using the $MoO_2Cl_2$ obtained in Comparative Example 1 as the raw material, the method of the present invention, including sublimation/reaggregation, was applied in a reduced-pressure atmosphere. Here, the device having the configuration of FIG. 2(b) was used to perform the sublimation/reaggregation of the $MoO_2Cl_2$. The $MoO_2Cl_2$ as the raw material was held in a raw material holding container of a sublimation device, and this was connected to one end of a reaction tube made of glass. The inside of the sublimation device was depressurized by being exhausted from the side while maintaining the other end of the reaction tube in a state where the inside of the tube can be observed from the upper part. In Example 1, the pressure inside the device was set to 1 kPa. In this state, the $MoO_2Cl_2$ in the raw material holding container was gradually heated, and held at a heating temperature of 95° C. in which the raw material can be stably sublimated. When this state is maintained, the $MoO_2Cl_2$, which was transferred and reaggregated after being sublimated, was accumulated at the upper part of the reaction tube. The temperature of the reaggregated part was 75° C. Finally, the $MoO_2Cl_2$ accumulated in the reaction tube was cooled and thereafter collected. FIG. 4 shows the appearance of the $MoO_2Cl_2$ obtained in Example 1. The $MoO_2Cl_2$ obtained in Example 1 had a bulk density of 1.0 $g/cm^3$, and a purity of 5N5.

Example 2

Figure 5:
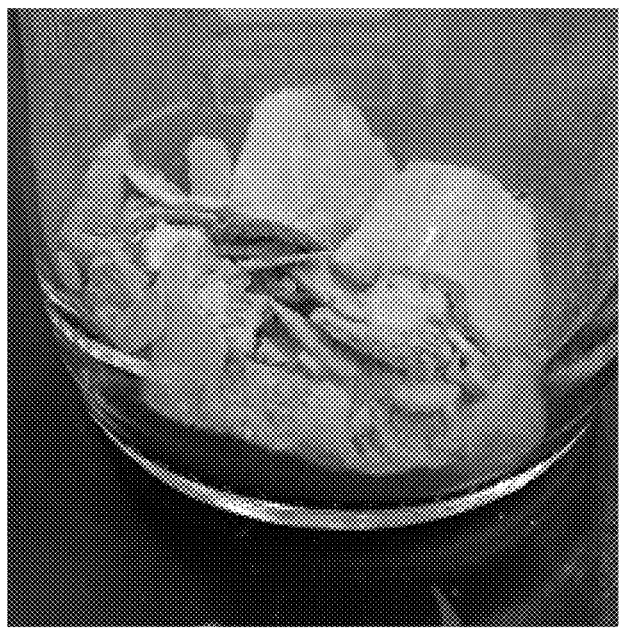
FIG. 5 is a diagram showing the appearance of the molybdenum oxychloride of Example 2.

The pressure inside the device was set to 5 kPa, and the raw material $MoO_2Cl_2$ was subject to sublimation/reaggregation in the same manner as Example 1. In Example 2, the temperature that the raw material $MoO_2Cl_2$ can be stably sublimated was 117° C., and the heating temperature of the raw material $MoO_2Cl_2$ was held at this temperature. Here, the temperature of the reaggregated part was 97° C. In this state, the sublimation/reaggregation of the $MoO_2Cl_2$ was performed until the sublimated sediment no longer increased based on visual observation while adjusting the position in the reaction tube where the reaggregated $MoO_2Cl_2$ is accumulated. Finally, when the $MoO_2Cl_2$ accumulated in the reaction tube was cooled and thereafter collected, it became separated from the inner wall of the reaction tube with relatively weak force, and could be easily recovered. FIG. 5 shows the appearance of the $MoO_2Cl_2$ obtained in Example 2. The $MoO_2Cl_2$ obtained in Example 2 had a bulk density of 1.1 $g/cm^3$, and a purity of 5N5. Only blue floccose residue was observed in the raw material holding container.

Example 3

Figure 6:
FIG. 6 is a diagram showing the appearance of the molybdenum oxychloride of Example 3.

The pressure inside the device was set to 20 kPa, and the raw material $MoO_2Cl_2$ was subject to sublimation/reaggregation in the same manner as Example 1. In Example 3, the temperature that the raw material $MoO_2Cl_2$ can be stably sublimated was 135° C., and the heating temperature of the raw material $MoO_2Cl_2$ was held at this temperature. Here, the temperature of the reaggregated part was 115° C. In this state, the sublimation/reaggregation of the $MoO_2Cl_2$ was performed until the sublimated sediment no longer increased based on visual observation while adjusting the position in the reaction tube where the reaggregated $MoO_2Cl_2$ is accumulated. Finally, when the $MoO_2Cl_2$ accumulated in the reaction tube was cooled and thereafter collected, the sediment tended to become hard and affixed to the inner wall of the reaction tube, and much effort was required for collecting the $MoO_2Cl_2$ in comparison to Examples 1 and 2. FIG. 6 shows the appearance of the $MoO_2Cl_2$ obtained in Example 3. The $MoO_2Cl_2$ obtained in Example 3 had a bulk density of 1.2 $g/cm^3$, and a purity of 5N5. In addition to blue floccose residue, non-sublimated $MoO_2Cl_2$ also remained in the raw material holding container.

Comparative Example 2

The pressure inside the device was set to an atmospheric pressure (101.3 kPa), and the raw material $MoO_2Cl_2$ was subject to sublimation/reaggregation in the same manner as Example 1. In Comparative Example 2, the temperature that the raw material $MoO_2Cl_2$ can be stably sublimated was 200° C., and the heating temperature of the raw material $MoO_2Cl_2$ was held at this temperature. Here, the temperature of the reaggregated part was 185° C. In this state, the sublimation/reaggregation of the $MoO_2Cl_2$ was performed until the sublimated sediment no longer increased based on visual observation while adjusting the position in the reaction tube where the reaggregated $MoO_2Cl_2$ is accumulated. Finally, when the $MoO_2Cl_2$ accumulated in the reaction tube was cooled and thereafter collected. The $MoO_2Cl_2$ obtained in Comparative Example 2 had a bulk density of 0.8 $g/cm^3$, and a purity of 5N. In order to recover the $MoO_2Cl_2$ as a solid, it is necessary to sufficiently lower the temperature of the gaseous sublimate, and consequently the device needs to be enlarged (longer than the entire length of 210 in FIG. 2), and there is a problem in that the amount of the product that can be recovered will decrease. There is also a problem in that the gaseous sublimate, which was not sufficiently cooled, becomes precipitated at the reaction tube discharge part, and clogs the reaction tube discharge part.

Example 4

Example 4 is an example in which sublimation and reaggregation are not performed in a reduced-pressure atmosphere, which is one means in the present invention, in the same manner as Comparative Example 1; that is, an example of only performing the synthesis of molybdenum oxychloride. A major difference in comparison to Comparative Example 1 is that the temperature of the part where chloride is precipitated, solidified and recovered was held in a range of 40° C. to 120° C., and the density of the recovery was increased by growing the crystals at the precipitated part.

A high purity $MoO_3$ (purity: 4N) powder in an amount of 63.2 g was placed in a holding container made of quartz, and this was disposed at the end of an L-shaped reaction tube made of quartz. While supplying a nitrogen gas as a carrier gas into the reaction tube, and the $MoO_3$ was gradually heated with an electric furnace and the heating temperature of the $MoO_3$ was retained upon reaching 720° C. When a $Cl_2$ gas was supplied into the reaction tube in this state at a flow rate of 30 mL/minute, the $MoO_3$ and $Cl_2$ were reacted, the generated $MoO_2Cl_2$ in a vapor phase state was transported from the reaction tube to the collection container, and the $MoO_2Cl_2$ became precipitated as thick crystals within the collection container maintained at 100° C. with a heater. The reaction could be advanced to the end without the floccular precipitate filling the container and clogging the pipe as in Comparative Example 1. The obtained $MoO_2Cl_2$ had a bulk density of 1.2 g/cm³, and a purity of 5N. The $MoO_2Cl_2$ yield amount was 65 g, and the yield rate was 74.5%. This is assumed to be because a large amount of chloride was discharged to the outside in gaseous form, without becoming solidified, due to the high temperature of the recovery part.

Example 5

Example 5 is the same as Example 4 other than the charge-in quantity being set to 61.1 g, and only the temperature of the recovery part being lowered to 50° C. to precipitate the $MoO_2Cl_2$. The obtained $MoO_2Cl_2$ had a bulk density of 0.6 g/cm³, and a purity of 5N. Because the temperature of the recovery part was lowered, it is assumed that the crystals bonded together slowly and could not be grown, and became an aggregate of small crystals. The $MoO_2Cl_2$ yield amount was 72 g, and the yield rate was 85.3%. This is assumed to be because the amount of crystal precipitation at the recovery part was greater in comparison to Example 4.

The foregoing results are summarized in Table 1. Based on these results, it was confirmed that both the bulk density and purity of the $MoO_2Cl_2$ collected after undergoing sublimation/reaggregation had improved in a reduced-pressure atmosphere under any of the conditions of Examples 1 to 3 in comparison to the state of the raw material. When the ambient pressure is near 20 kPa, the sublimation rate is fast since the sublimation temperature becomes high, and clogging tends to occur even near the raw material, and it becomes difficult to stably control the sublimation/reaggregation. In the sublimation/reaggregation under an atmospheric pressure, while the purity will improve, the bulk density will decrease, and the exhaust pipe tends to become clogged with gaseous sublimate, and the device needs to be enlarged and production also becomes difficult. Accordingly, the ambient pressure is preferably set to a range of 1 to 10 kPa, preferably near 5 kPa, in order to stably control the sublimation/reaggregation of the $MoO_2Cl_2$.

Moreover, in directly recovering chloride without performing reduced-pressure sublimation, a highly dense solid can be recovered by properly controlling the temperature of the chloride recovery part, and, while the purity will decrease slightly in comparison to the case of performing reduced-pressure sublimation, there is no major problems in terms of use with the quality being 5N.

TABLE 1

| | Comparative Example 1 | Example 1 | Example 2 | Example 3 | Comparative Example 2 | Example 4 | Example 5 |
|---|---|---|---|---|---|---|---|
| Sublimation/Reaggregation | None | Observed | Observed | Observed | Observed | None | None |
| Chloridation temperature (° C.) | 720 | 720 | 720 | 720 | 720 | 720 | 720 |
| Chloride recovery part temperature (° C.) | 25 | 25 | 25 | 25 | 25 | 100 | 50 |
| Sublimation atmospheric pressure (kPa) | — | 1 | 5 | 20 | 101.3 (atmospheric pressure) | — | — |
| Sublimation temperature (° C.) | — | 95 | 117 | 135 | 200 | — | — |
| Sublimate recovery part temperature (° C.) | — | 64 | 71 | 75 | 100 | — | — |
| Clogging of reaction tube discharge part | — | None | None | None | Observed | — | — |
| Bulk density (g/cm³) | 0.05 | 1.0 | 1.1 | 1.2 | 0.8 | 1.2 | 0.6 |
| Purity | 4N | 5N5 | 5N5 | 5N5 | 5N5 | 5N | 5N |

The present invention can achieve a higher bulk density of molybdenum oxychloride, which has a low bulk density and synthesized with a conventional synthesizing method, thereby increase the hygroscopicity resistance, and reduce impurities to achieve a higher purity. Thus, the present invention can offer considerable technical contribution to industries and technical areas such as the semiconductor industry, electronic device production, functional material fabrication, and organic/inorganic chemical industry which forms thin films or synthesizes compounds by using a molybdenum oxychloride as a raw material or a catalyst of CVD or ALD.

DESCRIPTION OF REFERENCE NUMERALS 100 synthesizing apparatus
101 $MoO_3$ raw material
102 raw material holding container
103 reactor vessel
104 raw material heating device
105 gas inlet
106 gas pipe 107 collection container
108 exhaust pipe
109 vacuum pipe
110 synthesized molybdenum oxychloride
201 raw material holding container
202 molybdenum oxychloride raw material
203 raw material heating device
204 reaggregation/precipitation unit
205 liquid-nitrogen trap
206 vacuum pumping unit
207 cooling water (aspiration)
208 cooling water (discharge)
210 reaction tube
211 temperature control mechanism
212 view port

The invention claimed is:

1. A method of producing a molybdenum oxychloride comprising the steps of retaining a gaseous raw material molybdenum oxychloride, which was synthesized based on a reaction of a molybdenum oxide powder and chlorine gas at 700° C. or higher in a vapor phase with inert gas as a carrier gas, at a temperature range of 40° C. or higher and 100° C. or less in an atmospheric pressure, growing crystals of molybdenum oxychloride from the gaseous raw material, and obtaining the crystals of molybdenum oxychloride having a bulk density in an inert atmosphere, wherein the bulk density of the crystals of molybdenum oxychloride is 1.0 g/cm$^3$ or more and a purity of the crystals of molybdenum oxychloride is 99.999 wt % (5N) or higher.

2. The method of producing a molybdenum oxychloride according to claim 1, wherein the crystals of molybdenum oxychloride is one among molybdenum dichloride dioxide ($MoO_2Cl_2$), molybdenum trichloride oxide ($MoOCl_3$) or molybdenum tetrachloride oxide ($MoOCl_4$).

3. The method of producing a molybdenum oxychloride according to claim 2, further comprising the step of synthesizing the gaseous raw material molybdenum oxychloride based on a reaction of a molybdenum dioxide ($MoO_2$) powder or a molybdenum trioxide ($MoO_3$) powder and chlorine gas ($Cl_2$) at 700° C. or higher with inert gas as a carrier gas.

4. The method of producing a molybdenum oxychloride according to claim 1, further comprising the step of synthesizing the gaseous raw material molybdenum oxychloride based on a reaction of a molybdenum dioxide ($MoO_2$) powder or a molybdenum trioxide ($MoO_3$) powder and chlorine gas ($Cl_2$) at 700° C. or higher with inert gas as a carrier gas.

5. A method of producing a molybdenum oxychloride, comprising the steps of:
synthesizing a gaseous raw material molybdenum oxychloride based on a reaction of a molybdenum oxide powder and chlorine gas at 700° C. or higher in a vapor phase with inert gas as a carrier gas;
retaining the gaseous raw material molybdenum oxychloride at a temperature range of 40° C. or higher and 100° C. or less in an atmospheric pressure to grow crystals of molybdenum oxychloride from the gaseous raw material such that the crystals of molybdenum oxychloride have a bulk density of 1.0 g/cm$^3$ or more and a purity of 99.999 wt % (5N) or higher; and
collecting the crystals of molybdenum oxychloride in an inert atmosphere.

6. The method according to claim 5, wherein the molybdenum oxide powder is molybdenum dioxide ($MoO_2$) powder or molybdenum trioxide ($MoO_3$) powder, wherein the chlorine gas is a $Cl_2$ gas, and wherein the crystals of molybdenum oxychloride are crystals of molybdenum dichloride dioxide ($MoO_2Cl_2$), molybdenum trichloride oxide ($MoOCl_3$), or molybdenum tetrachloride oxide ($MoOCl_4$).

* * * * *